United States Patent [19]
Koga et al.

[11] Patent Number: 4,571,508
[45] Date of Patent: Feb. 18, 1986

[54] DIFFERENTIAL SWITCH CIRCUIT

[75] Inventors: Takashi Koga; Hideyuki Hagino, both of Yokohama, Japan

[73] Assignee: Tokyo Shibaura Denki Kabushiki Kaisha, Kawasaki, Japan

[21] Appl. No.: 426,759

[22] Filed: Sep. 29, 1982

[30] Foreign Application Priority Data

Oct. 8, 1981 [JP] Japan .................. 56-148793

[51] Int. Cl.$^4$ .......................... H03K 5/153
[52] U.S. Cl. ................... 307/360; 307/244; 307/361; 328/147
[58] Field of Search ........... 307/360, 361, 363, 354, 307/244, 254; 328/146, 147

[56] References Cited

U.S. PATENT DOCUMENTS

| | | | |
|---|---|---|---|
| 3,041,469 | 4/1962 | Ross. | |
| 3,216,005 | 11/1965 | Hoffman et al. | 307/360 |
| 3,335,292 | 8/1967 | Alburger | 307/361 |
| 3,400,279 | 9/1968 | Grant | 307/360 |
| 3,633,045 | 1/1972 | Nordling | 307/360 |
| 4,203,043 | 5/1980 | Katakura | 307/254 |

FOREIGN PATENT DOCUMENTS

| | | |
|---|---|---|
| 1261003 | 1/1972 | United Kingdom. |
| 1524230 | 9/1978 | United Kingdom. |
| 1604323 | 12/1981 | United Kingdom. |
| 1604324 | 12/1981 | United Kingdom. |
| 2082411 | 3/1982 | United Kingdom. |

OTHER PUBLICATIONS

"Designers Casebook" from Electronics magazine, Jul. 8, 1968.

Primary Examiner—John Zazworsky
Attorney, Agent, or Firm—Cushman, Darby and Cushman

[57] ABSTRACT

A differential switch circuit having an input circuit being responsive to an input signal for providing switch instructions corresponding to the level of the input signal, a bias circuit coupled to the input circuit for generating bias signals respectively corresponding to the switch instructions, and a differential transistor circuit coupled to the bias circuit for providing a plurality of outputs in accordance with the potential of each of the bias signals. The input circuit includes comparators which respond to three levels of the input signal and provide the switch instructions in a manner so that the switch instructions respectively correspond to the levels of the input signal. The bias circuit includes three bias sources. Each of the bias sources generates one of the bias signals according to the switch instructions. The differential transistor circuit includes a current source and three switch transistors each of which emitter is coupled to the current source, each of which base receives one of the bias signals, and each of which collector provides one of the outputs.

27 Claims, 19 Drawing Figures

DIFFERENTIAL SWITCH CIRCUIT

BACKGROUND OF THE INVENTION

The present invention relates to an electronic switch circuit which can selectively provide any one of three or more outputs in accordance with a specific level of one input.

NTSC system and CCIR system are assigned to the architecture of a video tape recording/reproducing system (hereinafter referred to as "VTR" system). In addition, the beta format of NTSC system contains a βII mode being adapted to a standard tape transporting speed and a βIII mode being adapted to a low tape transporting speed for a long recording time. Accordingly, in a VTR system being applicable to those three modes(βII, βIII and CCIR), it is necessary to change the operation mode of the an internal circuit of VTR according to the kind of VTR architecture and to the tape transporting speed. Where such an internal circuit of the VTR is made of a semiconductor integrated circuit(hereinafter referred to as "IC"), the IC package requires two exclusive external terminals (pins). One of the terminals is used for designating the kind of architecture(NTSC or CCIR), and the other is used for selecting the tape transporting speed (βII of βIII).

Generally speaking, the number of external pins of the IC should be as small as possible because a large number of IC pins enlarges the size of IC package. A large sized IC inevitably invites substantial disadvantages: increase of a unit cost of an IC, difficulty in a compact design of electronic circuit block, etc. Further, in general, the number of external pins of IC is standardized as seen in a dual in-line type mold package. When a switch circuit for selecting one of said three modes (βII, βIII and CCIR) is practically designed, according to prior art, two input pins for the mode selection are necessary.

SUMMARY OF THE INVENTION

It is accordingly an object of the present invention to provide an electronic switch circuit being free from the aforementioned drawbacks. In particular object of the present invention is to provide a differential switch circuit which can provide three outputs with one input and is suitable for a circuit integration.

To achieve the above objects, a differential switch circuit of the present invention includes an input circuit, a bias circuit and a differential transistor circuit. The input circuit is responsive to three or more levels (H,M,L) of one input signal (Ei) and provides instructions (I1,I2,I3) which respectively correspond to the levels of the input signal. The bias circuit is responsive to the instructions of the input circuit and provides three or more bias signals (V1,V2,V3). The levels of these bias signals respectively correspond to the levels of the input signal. The differential transistor circuit includes three or more switch transistors (Q1,Q2,Q3), each of which has an emitter coupled to a current source, and each of which has a collector that provides one of three or more outputs of the switch circuit, and each of which has a base that receives one of the bias signals. Which transistor of the differential transistor circuit is turned on is determined upon which potential of the bias signals is highest. For instance, where the differential transistor circuit includes first, second and third transistors, and the base bias potential of first transistor is highest, the first transistor provides at its collector a first output. Similarly, when the base bias potential of second transistor is higher than the others, the second transistor provides at its collector a second output, and when the third transistor has highest base potential, the third transistor provides a third output at its collector.

For the differential switch circuit of the present invention, only one terminal for the input signal is satisfactory. Accordingly, where the differential switch circuit of the present invention is circuit-integrated, being different from the prior art which has two independent inputs, one input pin can be saved. Further, since the switching elements(transistors) have a differential cirucit configuration, the stability of circuit operation is superior.

DETAILED DESCRIPTION OF THE PREFERRED EMBODIMENT

Now, the preferred embodiment of the present invention will be described in detail with reference to the accompanying drawings. In the description the same or similar reference symbol is used to designate the same or similar element for brevity's sake.

Figure 1:
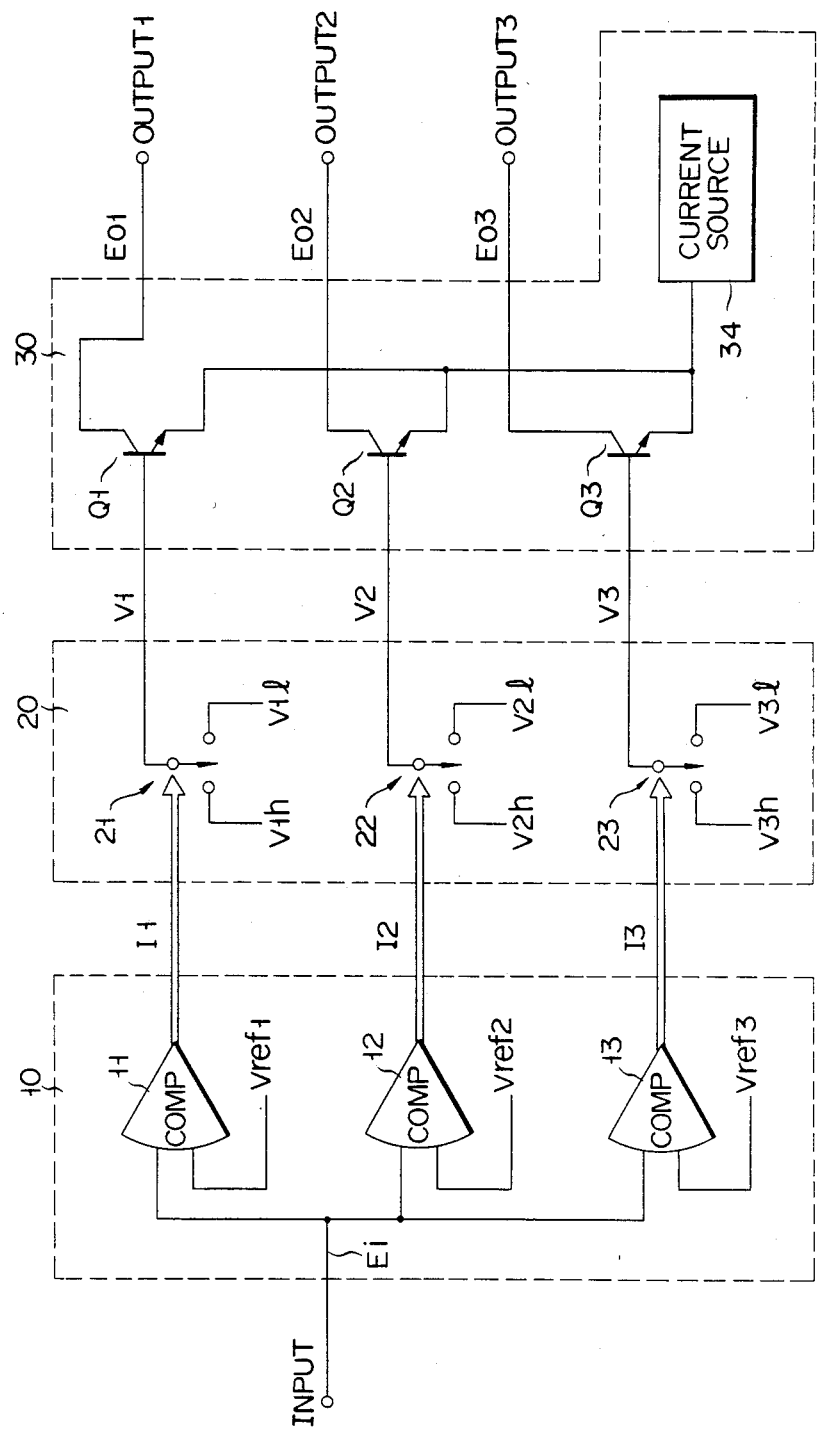
FIG. 1 shows a basic configuration of a differential switch circuit of the present invention.

FIG. 1 shows a basic configuration of a differential switch circuit of the present invention. An input signal Ei which designates a specific output of the switch circuit is applied to comparators 11, 12 and 13. Comparators 11, 12 and 13 receive first, second and third reference potentials Vref1, Vref2 and Vref3, respectively. These reference potentials used here are so selected that Vref1>Vref2=Vref3 for example. Comparator 11 compares the potential of input signal Ei with reference potential Vref1. When Ei>Vref1, comparator 11 outputs a switch instruction I1 indicating that input signal Ei has a high level, i.e. Ei=H. Comparator 13 compares the potential of input signal Ei with reference potential Vref3. When Ei<Vref3, comparator 13 outputs a switch instruction I3 indicating that input signal Ei has a low level, i.e. Ei=L. Comparator 12 compares the potential of input signal Ei with reference potential Vref2. When Ei>Vref2, comparator 12 outputs a switch instruction I2 indicating that input signal Ei has a medium level, i.e. Ei=M. Although the relation Ei>Vref1 satisfies the relation Ei>Vref2 because of Vref1>Vref2, the medium level M of Ei can be distinguished from the high level H of Ei by a specific means (differential amplifier operation of transistors Q1 and Q2) mentioned later.

Comparators 11, 12 and 13 jointly constitute an input circuit 10 which provides switch instructions I1, I2 and I3 each corresponding to level of input signal Ei.

Instruction I1 is applied to a bias change switch 21 for generating a first bias signal V1. A first high potential V1h and a first low potential V1l are inputted to switch 21. Switch 21 generates high potential bias signal V1h when instruction I1 is applied. When instruction I1 is not applied, switch 21 generates low potential bias signal V1l. Similarly, instructions I2 and I3 are respectively applied to a bias change switch 22 for generating a second bias signal V2 and to a bias change switch 23 for generating a third bias signal V3. A second high potential V2h and a second low potential V2l are inputted to switch 22. A third high potential V3h and a third low potential V3l are inputted to switch 23. Switch 22 generates high potential bias signal V2h when instruction I2 is applied, and when instruction I2 is not applied, switch 22 generates low potential bias signal V2l. Switch 23 generates high potential bias signal V3h when instruction I3 is applied, and when instruction I3 is not applied, switch 23 generates low potential bias signal V3l.

Switches 21, 22 and 23 jointly constitute a bias circuit 20 which generates bias signals V1, V2 and V3 respectively corresponding to switch instructions I1, I2 and I3.

Bias signal V1 is applied to the base of an NPN transistor Q1. Similarly, bias signal V2 is applied to the base of an NPN transistor Q2, and bias signal V3 is applied to the base of an NPN transistor Q3. Each emitter of transistors Q1, Q2 and Q3 is coupled to a current source 34. The collector of transistor Q1 provides a first output Eo1, the collector of transistor Q2 provides a second output Eo2, and the collector of transistor Q3 provides a third output Eo3.

Transistors Q1, Q2 and Q3 and current source 34 jointly constitute a differential transistor circuit 30.

When the relation Ei=H>Vref1 is held, instruction I1 is provided so that V1=V1h. In this case, since Ei=H>Vref2 because of Vref1>Vref2=Vref3, instruction I2 is also provided so that V2=V2h. Further, since Ei=H>Vref3, instruction I3 is not provided and V3=V3l. In the configuration of FIG. 1, potentials V1h, V2h and V3l are so selected that V1h>V2h>V3l. Accordingly, only transistor Q1 is conducted according to the differential amplifier operation and only output Eo1 is obtained from the collector of transistor Q1. This is the said specific means for distinguishing the high level H of Ei from the medium level M of Ei.

When Vref1>Ei=M>Vref2, only instruction I2 is provided so that V1=V1l, V2=V2h and V3=V3l. In FIG. 1, potentials V1l, V2h and V3l are so selected that V2h>V1l and V2h>V3l. Accordingly, only transistor Q2 is conducted so that only output Eo2 is obtained from the collector of transistor Q2.

When Vref2=Vref3>Ei=L, only instruction I3 is provided so that V1=V1l, V2=V2l and V3=V3h. Since V3h>V1l and V3h>V2l, only transistor Q3 is conducted. Then, only output Eo3 is obtained from the collector of transistor Q3.

Incidentally, the relative representations "high" and "low" as to the level or potential may be inverted or exchanged according to the circuit design.

Figure 2:
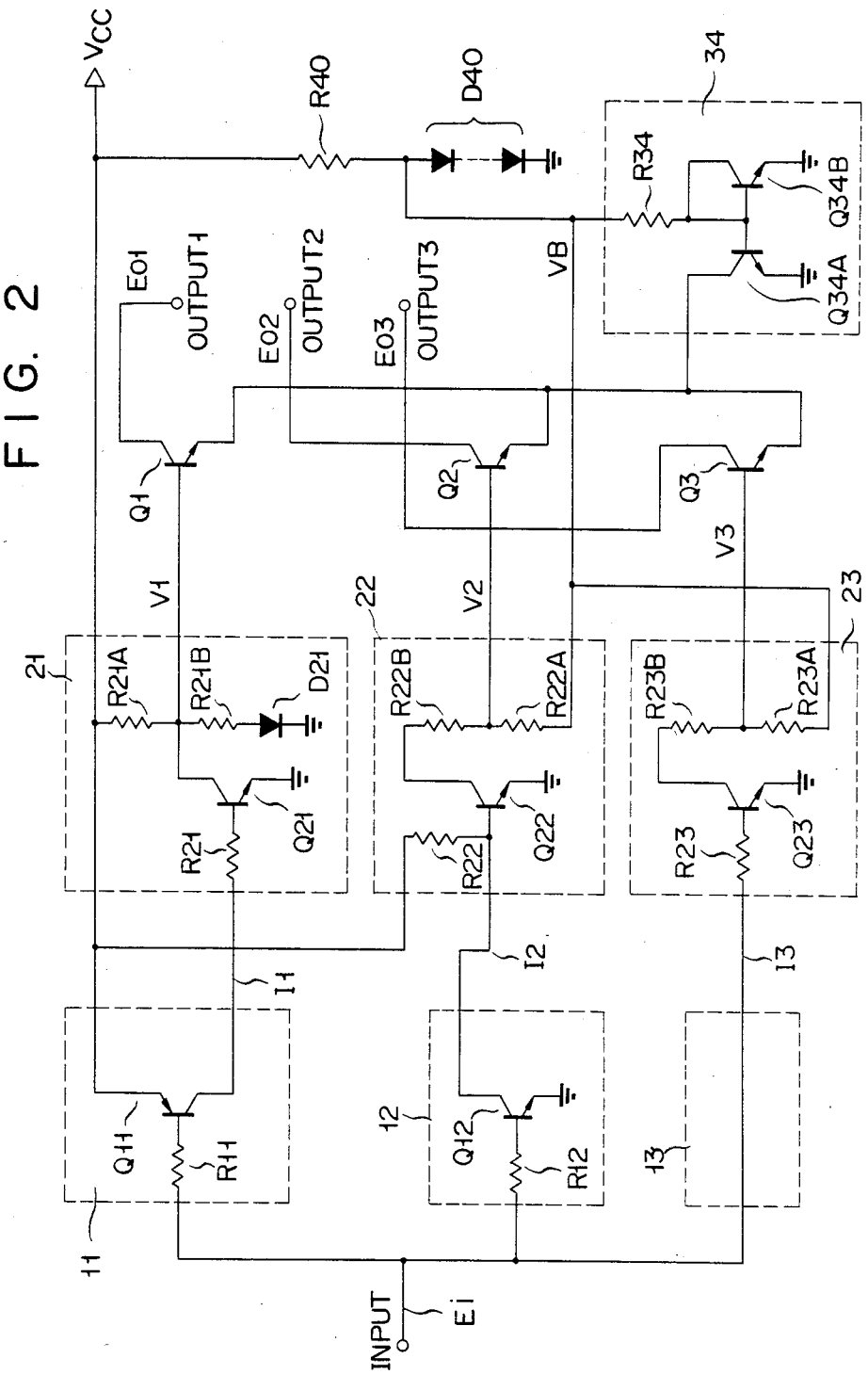
FIG. 2 shows a circuit embodying the configuration of FIG. 1.

FIG. 2 shows a circuit embodying the configuration of FIG. 1. Input signal Ei is applied via a resistor R11 to the base of a PNP transistor Q11. The emitter of transistor Q11 is coupled to a power supply line being supplied with a positive power supply potential Vcc. The collector of transistor Q11 is coupled via a resistor R21 to the base of an NPN transistor Q21. The emitter of transistor Q21 is grounded and the collector thereof is coupled via a resistor R21A to the Vcc line. The collector of transistor Q21 is grounded via a series circuit of a resistor R21B and a P-N junction diode D21. Diode D21 is forwardly biased by the current flowing from the Vcc line to the circuit ground through resistors R21A and R21B. Diode D21 provides at its anode a forward voltage drop VF. Obtained from the juncture between resistors R21A and R21B is a first bias signal V1.

Transistor Q11 forms a first comparator 11 of which reference level Vref1 for the comparison is $$Vref1 = Vcc - V_{BE11} \quad (1)$$

where $V_{BE11}$ denotes the base threshold voltage of transistor Q11. For instance, where Vcc=3.0V and $V_{BE11}$=0.5 V, then Vref1=2.5 V. Thus, comparator 11 requires no special source for generating reference level Vref1. When input signal Ei has level H, e.g., Ei=H=3.0V, transistor Q11 is not conducted and no collector current of transistor Q11 flows. This no collector current corresponds to a first switch instruction I1. Instruction I1 renders transistor Q21 nonconductive, and bias signal V1 becomes a first high potential V1h:

$$V1h = \frac{R21B}{R21A + R21B} (Vcc - VF) + VF \quad (2)$$

For instance, where R21A=1kΩ, R21B=6.8Ω, Vcc=3.0 V and VF=0.7 V, then V1h=2.7 V. When input signal Ei is not level H, i.e. Ei<Vref1, transistor Q11 and Q21 are conducted so that bias signal V1 becomes a first low potential V1l:

$$V1l = V_{CE(SAT)21} \quad (3)$$

where $V_{CE(SAT)21}$ denotes the collector saturation voltage or the voltage drop appearing across the collector-emitter path of transistor Q21 which is completely turned on. When $V_{CE(SAT)21}$ is 0.1 V, V1l is also 0.1 V.

Transistor Q21, diode D21 and resistors R21, R21A and R21B form a first bias source 21 for generating bias signal V1 having potential V1h or V1l.

Input signal Ei is applied via a resistor R12 to the base of an NPN transistor Q12. The emitter of transistor Q12 is grounded and the collector thereof is coupled to the base of an NPN transistor Q22. The base of transistor Q22 is coupled via a resistor R22 to the Vcc line. The emitter of transistor Q22 is grounded, and the collector thereof is coupled to the anode of diodes D40 via a series circuit of resistors R22A and R22B. The cathode of diodes D40 is grounded, and the anode thereof is coupled via a resistor R40 to the Vcc line. When three-stacked Si P-N junctions are used, a bias potential $V_B$ of about 2.1 V will be obtained from the anode of diodes D40. A second bias signal V2 is obtained from the juncture between resistors R22A and R22B.

Transistor Q12 and resistor R12 form a second comparator 12 of which reference level Vref2 for the comparison is $$Vref2 = V_{BE12} + \text{circuit ground potential} \quad (4)$$

where $V_{BE12}$ denotes the base threshold voltage of transistor Q12. Where $V_{BE12}$=0.6 V and the circuit ground potential is zero, then Vref2=0.6 V. Thus, comparator 12 requires no special source for generating reference level Vref2. When input signal Ei has level H or level M, e.g., Ei=M=1.5 V, transistor Q12 is conducted and a given collector current of transistor Q12 flows into resistor R22. This collector current corresponds to a second switch instruction I2. Instruction I2 pulls down the collector potential of transistor Q12 below the base threshold $V_{BE22}$ of transistor Q22. For instance, assume that Ei=1.5 V renders transistor Q12 conductive so that the collector current of transistor Q12 becomes 0.97 mA, and that R22=3.0kΩ, Vcc=3.0V and $V_{BE22}$=0.6 V. Then, the base potential of transistor Q22 becomes 0.1 V and transistor Q22 is rendered nonconductive. In this case, the potential of bias signal V2 becomes a second high potential V2h:

$$V2h = VB \quad (5)$$

When VB is 2.1 V, potential V2h is also 2.1 V. Where the level of input signal Ei is less than level M, i.e. Ei<Vref2 or Ei=L, transistor Q12 is turned off and transistor Q22 is turned on so that bias signal V2 becomes a second low potential V2l:

$$V2l = \frac{R22B}{R22A + R22B}\{VB - V_{CE(SAT)22}\} + V_{CE(SAT)22} \quad (6)$$

where $V_{CE(SAT)22}$ denotes the collector saturation voltage of transistor Q22. When R22A=R22B, $V_{CE(SAT)22}$=0.1 V and VB=2.1 V, then V2l=1.1 V.

Transistor Q22 and resistors R22, R22A and R22B form a second bias source 22 for generating bias signal V2 having potential V2h or V2l.

Input signal Ei is also applied via a resistor R23 to the base of an NPN transistor Q23. The emitter of transistor Q23 is grounded, and the collector thereof is coupled to the anode of diodes D40 via a series circuit of resistors R23A and R23B. A third bias signal V3 is obtained from the juncture between resistors R23A and R23B.

In the configuration of FIG. 2, third bias source 23 has a function for detecting the level L of input signal Ei. Accordingly, there is no special circuitry for detecting the level L. In other words, the wiring of the base circuit of transistor Q23 forms a third comparator 13 of which reference level Vref3 being used for the comparison is $$V_{ref3} = V_{BE23} + \text{circuit ground potential} \quad (6)$$

where $V_{BE23}$ denotes the base threshold voltage of transistor Q23. Where $V_{BE23}$ is 0.6 V, Vref3 is also 0.6 V. When input signal Ei has level L, e.g., Ei=L=0 V, no base current or a third switch instruction I3 is applied to the base of transistor Q23. Then, transistor Q23 is rendered nonconductive, and the potential of bias signal V3 is a third high potential V3h:

$$V3h = VB \quad (7)$$

When VB is 2.1 V, potential V3h is also 2.1 V. Where the level of input signal Ei is more than level L, i.e. Ei>Vref3 or Ei=M or Ei=H, transistor Q23 is turned on so that bias signal V3 becomes a third low potential V3l:

$$V3l = \frac{R23B}{R23A + R23B}\{VB - V_{CE(SAT)23}\} + V_{CE(SAT)23} \quad (8)$$

where $V_{CE(SAT)23}$ denotes the collector saturation voltage of transistor Q23. When R23A=R23B and $V_{CE(SAT)23}$=0.1 V and VB=2.1 V, then V3l=1.1 V.

Transistor Q23 and resistors R23, R23A and R23B form a third bias source 23 for generating bias signal V3 having potential V3h or V3l.

The juncture between resistors R21A and R21B is coupled to the base of an NPN transistor Q1. The juncture between resistors R22A and R22B is coupled to the base of an NPN transistor Q2. The juncture between resistors R23A and R23B is coupled to the base of an NPN transistor Q3. The collectors of transistors Q1, Q2 and Q3 respectively provide first, second and third outputs Eo1, Eo2 and Eo3. The emitters of transistors Q1, Q2 and Q3 are coupled to the collector of an NPN transistor Q34A. The emitter of transistor Q34A is grounded, and the base thereof is coupled to the base and collector of an NPN transistor Q34B. The emitter of transistor Q34B is grounded, and the base thereof is coupled via a resistor R34 to the anode of diodes D40.

Transistors Q34A and Q34B and resistor R34 form a constant current source or a constant current feeder 34.

Incidentally, the temperature coefficient ∂VF/∂T of the forward voltage drop VF of diode D21 is effective to cancel the temperature coefficient $\partial V_{BE}/\partial T$ of the base threshold voltage of transistor Q1, thereby avoiding a temperature drift of the operational condition of transistor Q1.

Figure 3:
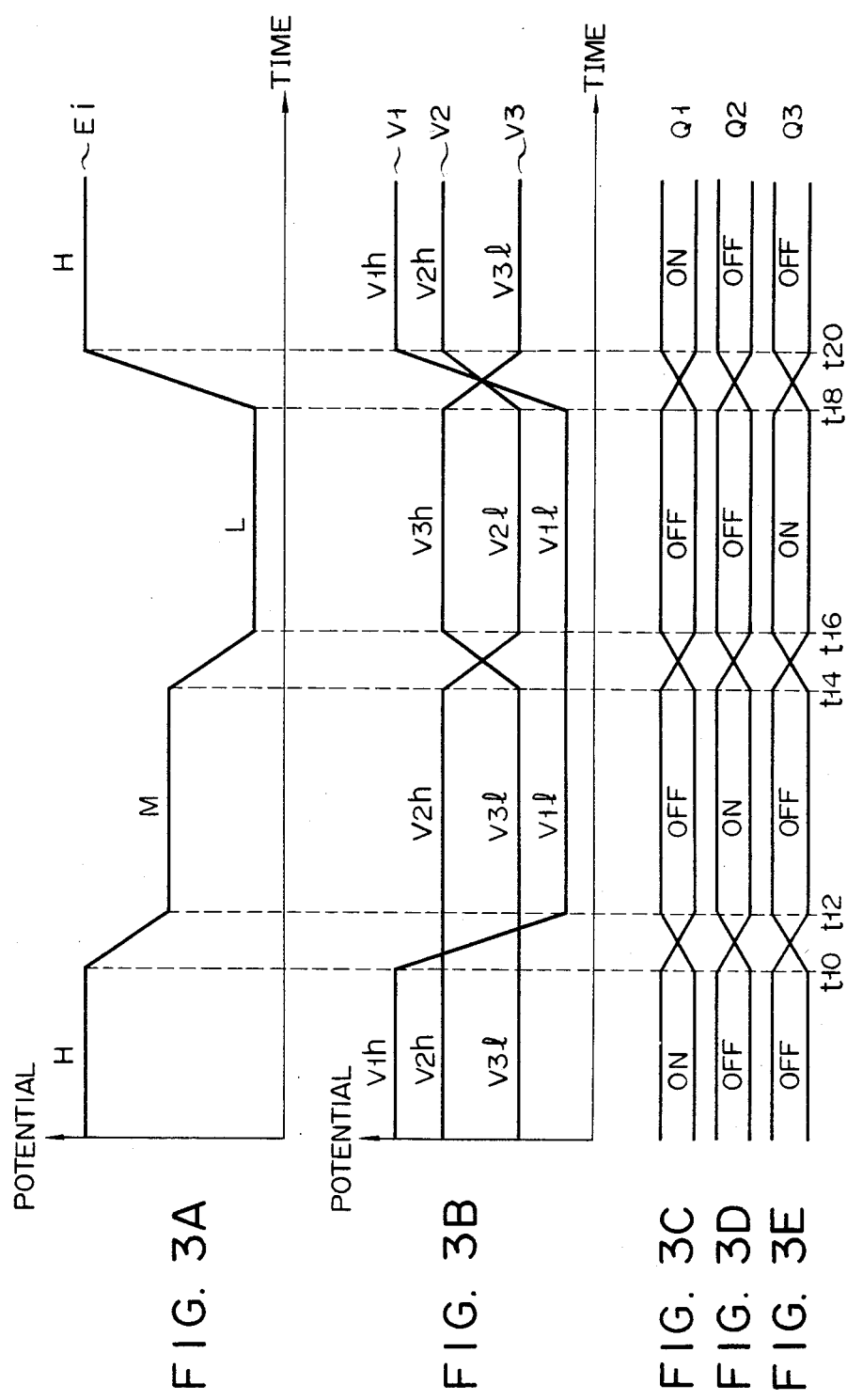
FIGS. 3A–3E are timing charts illustrating the operation of the circuit of FIG. 2.

Now explanation will be given to the circuit operation of FIG. 2 with reference to the timing charts of FIGS. 3A-3E. Before time t10, input signal Ei has H level (FIG. 3A). In this case, transistors Q11 and Q21 are both OFF so that V1=V1h, transistors Q12 and Q22 are ON and OFF, respectively, causing that V2=V2h, and transistor Q23 is ON so that V3=V3l (FIG. 3B). Since V1h>V2h or V3l (e.g. 2.7 V>2.1 V or 1.1 V), transistor Q1 is ON and transistors Q2 and Q3 are both OFF (FIGS. 3C-3E). Accordingly, only output Eo1 is obtained from the selected transistor Q1.

When the level of input signal Ei is changed to M (FIG. 3A; t12-t14), transistors Q11 and Q21 are both ON so that V1=V1l. In this case, since the M level is higher than Vref2=$V_{BE2}$ and Vref3=$V_{BE3}$, transistors Q12 and Q23 are ON and transistor Q22 is OFF so that V2=V2h and V3=V3l (FIG. 3B). Since V2h>V3l or V1l (e.g. 2.1V>1.1 V or 0.1 V), transistor Q2 is ON while transistor Q1 and Q3 are OFF (FIGS. 3C-3E). Accordingly, only output Eo2 is obtained from the selected transistor Q2.

When the level of input signal Ei is further changed to L (FIG. 3A; t16-t18), transistors Q11 and Q12 are ON, transistors Q12 and Q22 are OFF and ON, respectively, and transistor Q23 is OFF. In this case, V1=V1l, V2=V2l and V3=V3h (FIG. 3B). Since V3h>V2l or V1l (e.g. 2.1 V>1.1 V or 0.1 V), transistor Q3 is ON while transistors Q1 and Q2 are OFF (FIG. 3C-3E). Accordingly, only output Eo3 is obtained from the selected transistor Q3.

When the level of input signal Ei is returned to H (FIG. 3A; t20 and thereafter), the same condition as in the case before time t10 is provided. Thus, only output Eo1 is obtained.

Incidentally, in order to ensure the OFF of nonselected transistors, the base potential difference of transistors Q1, Q2 and Q3 between the highest one and the second higher one should be more than the base threshold voltage $V_{BE}$. For instance, before time t10 in FIG. 3B, $V1h - V2h \geq V_{BE}$, and between time t12 and time t14 in FIG. 3B, $V2h - V3h \geq V_{BE}$.

Figure 4:
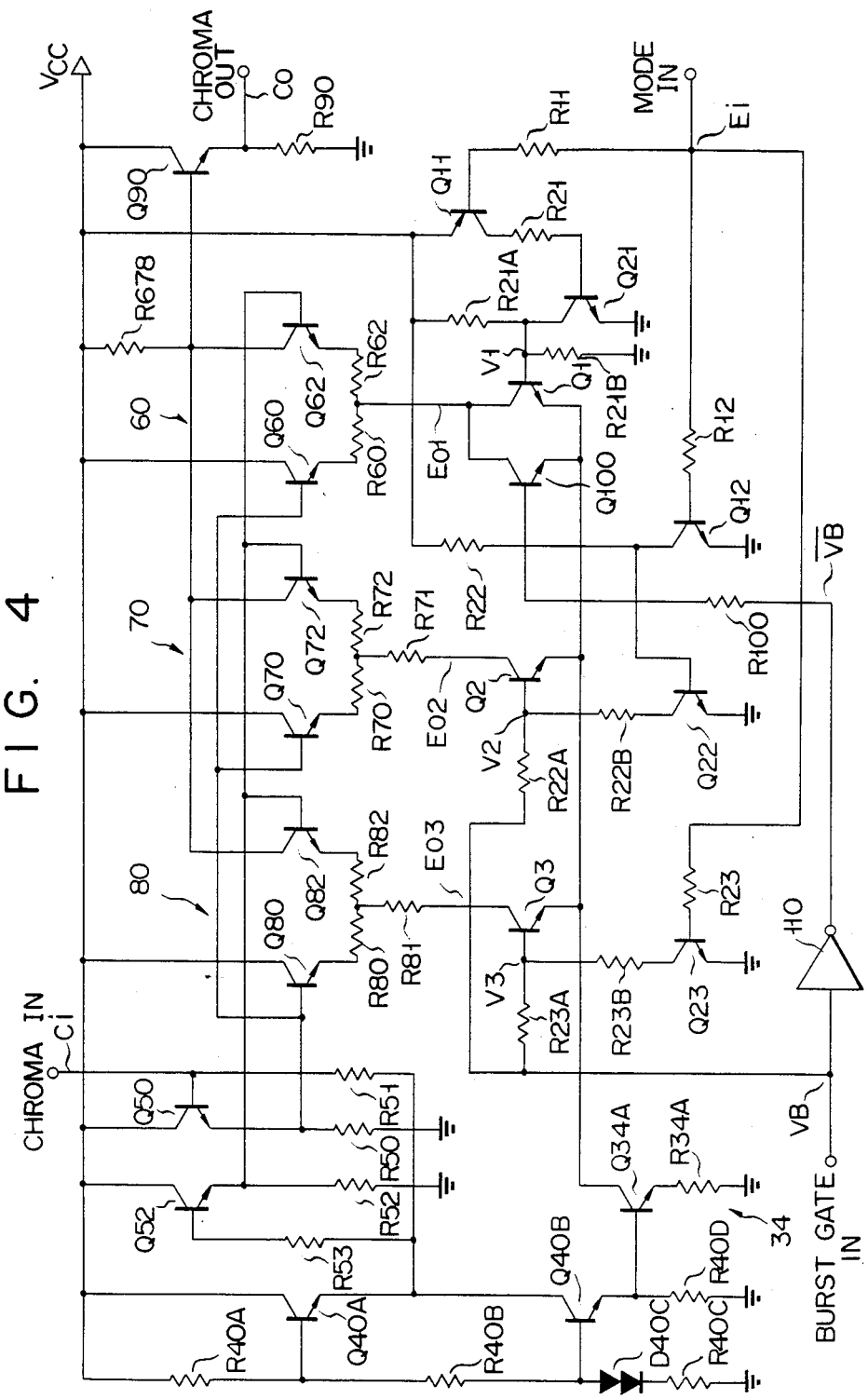
FIG. 4 shows a concrete cirucit arrangement containing the configuration of FIG. 1 wherein the differential switch circuit is used for changing the gain of a chroma amplifier.

FIG. 4 shows another embodiment of FIG. 1 configuration. FIG. 4 circuit is a burst emphasis circuit of VTR wherein only the amplitude of a burst signal contained in a chroma signal is selectively changed according to the level of mode input signal Ei. A chroma input Ci is applied to the base of an NPN transistor Q50. The collector of transistor Q50 is coupled to a circuit line with a power supply potential Vcc. The emitter of transistor Q50 is grounded via a resistor R50. Transistor Q50 forms a paired emitter follower circuit with an NPN transistor Q52. The collector of transistor Q52 is coupled to the Vcc line, and the emitter thereof is grounded via a resistor R52. The bases of transistors Q50 and Q52 are coupled respectively via resistors R51 and R53 to the emitter of an NPN transistor Q40A. The collector of transistor Q40A is coupled to the Vcc line, and the base thereof is coupled via a resistor R40A to the Vcc line. The emitter of transistor Q40A is coupled to the collector of an NPN transistor Q40B. The emitter of transistor Q40B is grounded via a resistor R40D, and the base thereof is coupled via a resistor R40B to the base of transistor Q40A. The base of transistor Q40B is further grounded via series circuit of a double-stacked P-N junction diodes D40C and a resistor R40C.

Coupled to the emitter of transistor Q50 are the bases of NPN transistors Q60, Q70 and Q80. Coupled to the emitter of transistor Q52 are the bases of NPN transistors Q62, Q72 and Q82. The collectors of transistors Q60, Q70 and Q80 are coupled to the Vcc line. The collectors of transistors Q62, Q72 and Q82 are coupled via a load resistor R678 to the Vcc line. The collectors of transistors Q62, Q72 and Q82 are coupled to the base of an NPN transistor Q90. The collector of transistor Q90 is coupled to the Vcc line, and the emitter thereof is grounded via a resistor R90. Obtained from the emitter of transistor Q90 is a chroma output Co.

The emitter of transistor Q60 is coupled via a series circuit of resistors R60 and R62 to the emitter of transistor Q62. The juncture between resistors R60 and R62 is coupled to the collectors of NPN transistors Q1 and Q100. The emitter of transistor Q70 is coupled via a series circuit of resistors R70 and R72 to the emitter of transistor Q72. The juncture between resistors R70 and R72 is coupled via a resistor R71 to the collector of an NPN transistor Q2. The emitter of transistor Q80 is coupled via a series circuit of resistors R80 and R82 to the emitter of transistor Q82. The juncture between resistors R80 and R82 is coupled via a resistor R81 to the collector of an NPN transistor Q3.

Transistors Q60 and Q62 and resistors R60 and R62 jointly form a differential amplifier 60 which is activated by a first output Eo1 of the differential switch circuit. Transistors Q70 and Q72 and resistors R70 to R72 jointly form a second differential amplifier 70 which is activated by a second output Eo2 of the differential switch circuit. Transistors Q80 and Q82 and resistors R80 to R82 jointly form a third differential amplifier 80 which is activated by a third output Eo3 of the differential switch circuit.

The emitters of transistors Q1, Q2 Q3 and Q100 are coupled to the collector of an NPN transistor Q34A. The base of transistor Q34A is coupled to the emitter of transistor Q40B, and the emitter thereof is grounded via a resistor R34A. Transistor Q34A and resistor R34A form a constant current source 34.

Transistors Q2 and Q3 respectively receive at their bases a burst gate input VB via resistors R22A and R23A. Burst gate input VB is level-inverted into an inverted burst gate $\overline{VB}$ by an inverter 110, and inverted burst gate $\overline{VB}$ is applied to the base of transistor Q100 via a resistor R100. The collector-emitter path of transistor Q100 is parallel connected to the collector-emitter path of transistor Q1. The base of transistor Q1 is coupled to the collector of an NPN transistor Q21. The collector of transistor Q21 is coupled via a resistor R21A to the Vcc line, and is grounded via a resistor R21B. The emitter of transistor Q21 is grounded, and the base thereof is coupled via a resistor R21 to the collector of a PNP transistor Q11. The emitter of transistor Q11 is coupled to the Vcc line. The base of transistor Q11 receives a mode input Ei via a resistor R11.

Mode input Ei is applied to the base of an NPN transistor Q12 via a resistor R12, and to the base of an NPN transistor Q23 via a resistor R23. The collector of transistor Q12 is coupled via a resistor R22 to the Vcc line, and is coupled to the base of an NPN transistor Q22. The collector of transistor Q22 is coupled via a resistor R22B to the base of transistor Q2, and the collector of transistor Q23 is coupled via a resistor R23B to the base of transistor Q3. The emitters of transistors Q12, Q22 and Q23 are grounded.

Figure 5:
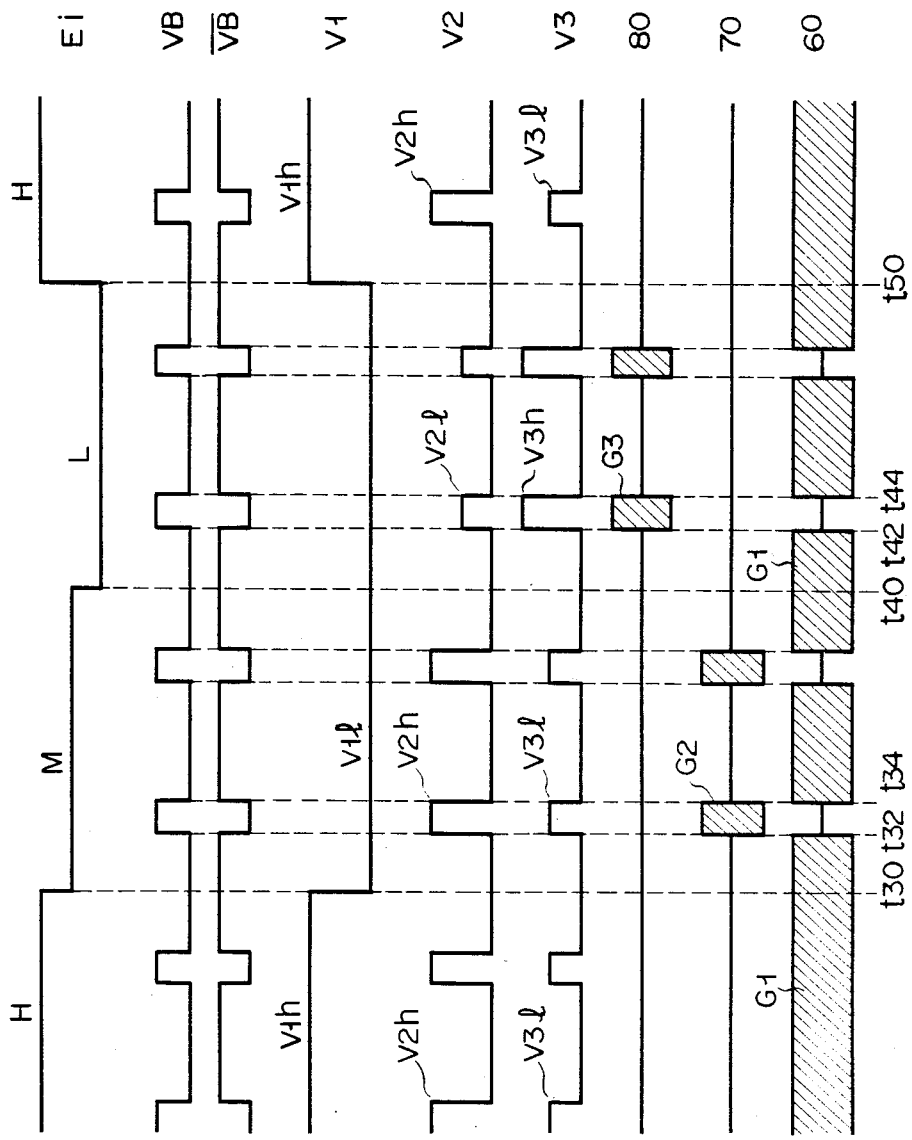
FIGS. 5A–5I are timing charts illustrating the operation of the circuit of FIG. 4.

Explanation will be given to the circuit operation of FIG. 4 with reference to the timing charts of FIGS. 5A-5I. Before time t30, since mode input Ei has H level (FIG. 5A), transistors Q11 and Q21 are OFF while transistors Q12 and Q23 are ON and transistor Q22 is OFF. The OFF of transistor Q11 brings a high potential V1h at the base of transistor Q1 (FIG. 5D). The OFF of transistor Q22 brings a high potential V2h at the base of transistor Q2 (FIG. 5E). The ON of transistor Q23 brings a low potential V3l at the base of transistor Q3 (FIG. 5F). Since the relation $V1h > V2h > V3l$ is established, transistor Q1 is ON while transistors Q2 and Q3 are OFF so that only the first differential amplifier 60 is activated by output Eo1 obtained from the collector of transistor Q1 (FIG. 5I). In this case, the transfer function from chroma input Ci to chroma output Co, or the gain G1 of differential amplifier 60 is $$G1 \approx \frac{R678}{2Rel} \qquad (9)$$

where Rel=R60=R62 and the current amplification factor hfe of each of transistors Q60 and Q62 is sufficiently large.

When the level of mode input Ei becomes M level (FIG. 5A; t30–t40), transistors Q11, Q21, Q12 and Q23 are ON, and transistor Q22 is OFF so that the base of transistor Q1 receives a low potential V1l (FIG. 5D). When the level of burst gate input VB is low and the level of inverted burst gate $\overline{VB}$ is high (FIG. 5B and 5C; t30–t32), the base potential of each of transistors Q2 and Q3 is low (FIGS. 5E and 5F) regardless of the ON/OFF of transistors Q22 and Q23. In this case, transistor Q100 is ON while transistors Q1 to Q3 are OFF so that only differential amplifier 60 is activated, thereby the gain G1 is effected.

Where the levels of VB and $\overline{VB}$ are high and low, respectively (FIGS. 5B and 5C; t32–t34), and transistors Q22 and Q23 are OFF and ON, respectively, then transistor Q2 receives at its base high potential V2h and transistor Q3 receives at its base low potential V3*l* (FIGS. 5E and 5F). Since the relations V2*h*>V1*l* and V2*h*>V3*l* are established, transistor Q2 is ON while transistors Q1, Q3 and Q100 are OFF so that only the second differential amplifier 70 is activated by output Eo2 obtained from the collector of transistor Q2 (FIG. 5H). In this case, the gain G2 of differential amplifier 70 is $$G2 \approx \frac{R678}{2Re2} \quad (10)$$

Where Re2=R70=R72 and the current amplification factor hfe of each of transistors Q70 and Q72 is sufficiently large.

Where the level of mode input Ei becomes L level (FIG. 5A; t40-t50), then transistors Q11 and Q21 are ON, transistors Q12 and Q23 are OFF, and transistor Q22 is ON. When the levels of VB and $\overline{VB}$ are low and high, respectively (FIGS. 5B and 5C; t40-t42), the base potential of each of transistors Q2 and Q3 is low (FIGS. 5E and 5F). Then, transistor Q100 is ON so that only differential amplifier 60 is activated, thereby the gain G1 is effected.

Where the levels of VB and $\overline{VB}$ are high and low, respectively (FIGS. 5B and 5C; t42-t44), and transistors Q22 and Q23 are ON and OFF, respectively, then transistor Q2 receives at its base low potential V2*l* and transistor Q3 receives at its base high potential V3*h* (FIGS. 5E and 5F). Since the relations V3*h*>V1*l* and V3*h*>V2*l* are established, transistor Q3 in ON while transistors Q1, Q2 and Q100 are OFF so that only the third differential amplifier 80 is activated by output Eo3 obtained from the collector of transistor Q3 (FIG. 5G). In this case, the gain G3 of differential amplifier 80 is $$G3 \approx \frac{R678}{2Re3} \quad (11)$$

where Re3=R80=R82 and the current amplification factor hfe of each of transistor Q80 and Q82 is sufficiently large.

Incidentally, for assuring the DC operational condition of each of differential amplifiers 60, 70 and 80 is constant, it is preferable to establish the following relation:

R60 || R62=R70 || R72+R71=R80 || R82+R81   (12)

where the symbol " || " denotes the parallel connection.

Figure 6:
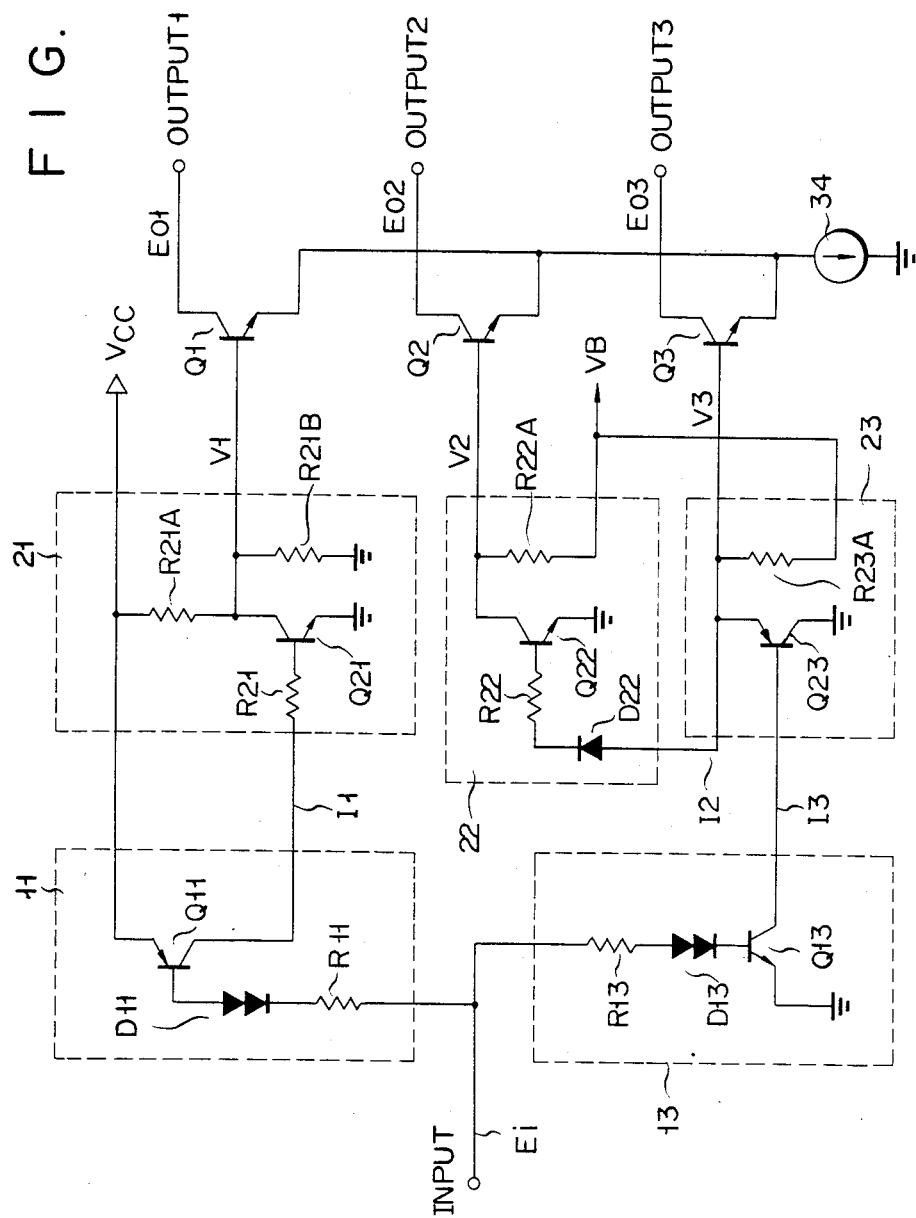
FIG. 6 shows another circuit embodying the configuration of FIG. 1.

FIG. 6 shows another circuit embodying the configuration of FIG. 1. In FIG. 6 circuit, level shift diodes D11 are provided in the base circuit of a PNP transistor Q11 of first comparator 11, and level shift diodes D13 are provided in the base circuit of an NPN transistor Q13 of third comparator 13. Thus, the reference level Vref1 of comparator 11 is Vref1=Vcc−$V_{BE11}$−VF11   (13)

where $V_{BE11}$ denotes the base threshold voltage of transistor Q11 and VF11 denotes the forward voltage drop of diodes D11. The reference level Vref3 of comparator 13 is Vref3=$V_{BE13}$+VF13   (14)

where $V_{BE13}$ denotes the base threshold voltage of transistor Q13 and VF13 denotes the forward voltage drop of diodes D13. Diodes D11 enhance the noise margin of comparator 11, and diodes D13 enhance the noise margin of comparator 13.

No collector current of transistor Q11 corresponds to a first switch instruction I1, and no collector current of transistor Q13 corresponds to a third switch instruction I3. Instruction I1 renders an NPN transistor Q21 nonconductive so that the collector of transistor Q21 provides V1=V1*h*=Vcc·R21B/(R21A+R21B). When instruction I1 is not applied, i.e. the collector current of transistor Q11 renders transistor Q21 conductive, the collector of transistor Q21 provides V1=V1*l*=$V_{CE(SAT)21}$. Similary, instruction I3 renders a PNP transistor Q23 nonconductive so that the emitter of transistor Q23 provides V3=V3*h*≈VB, provided R22>>R23A. When instuction I3 is not applied, i.e. the collector current of transistor Q13 renders transistor Q23 conductive, the emitter of transistor Q23 provides V3=V3*l*=$V_{CE(SAT)13}$+$V_{BE23}$. This V3*l* corresponds to a second switch instruction I2. Thus, instruction I2 renders an NPN transistor Q22 non-conductive so that the collector of transistor Q22 provides V2=V2*h*=VB. When instruction I2 is not provided, i.e. the emitter potential of transistor Q23 is V3*h* so that transistor Q22 is turned on, then the collector of transistor Q22 provides V2=V2*l*=$V_{CE(SAT)22}$.

When the level of input Ei is H, transistors Q11 and Q21 are OFF so that V1=V1*h*, and transistors Q13 and Q23 are ON so that V3=V3*l*. In this case, since V3=V3*l*, transistor Q22 is OFF so that V2=V2*h*. Here a level shift diode D22 is provided in the base circuit of transistor Q22. The forward voltage drop VF22 of diode 22 enhances the ON/OFF threshold level of transistor Q22. Thus, $V_{BE22}$+VF22>V3*l* and transistor Q22 is completely turned off when V3=V3*l*. Since V1=V1*h*, V2=V2*h* and V3=V3*l*, and V1*h*>V2*h*>V3*l*, only output Eo1 is obtained from the collector of transistor Q1.

When the level of input Ei is M, transistors Q11, Q21, Q13 and Q23 are ON while transistor Q22 is OFF so that V1=V1*l*, V2=V2*h* and V3=V3*l*. Since V2*h*>V1*l* and V2*h*<V3*l*, only output Eo2 is obtained from the collector of transistor Q2.

When the level of input Ei is L, transistors Q11 and Q21 are ON, transistors Q13 and Q23 are OFF, and transistor Q22 is On so that V1=V1*l*, V2=V2*l* and V3=V3*h*. Since V3*h*>V1*l* and V3*h*>V2*l*, only output Eo3 is obtained from the collector of transistor Q3.

Figure 7:
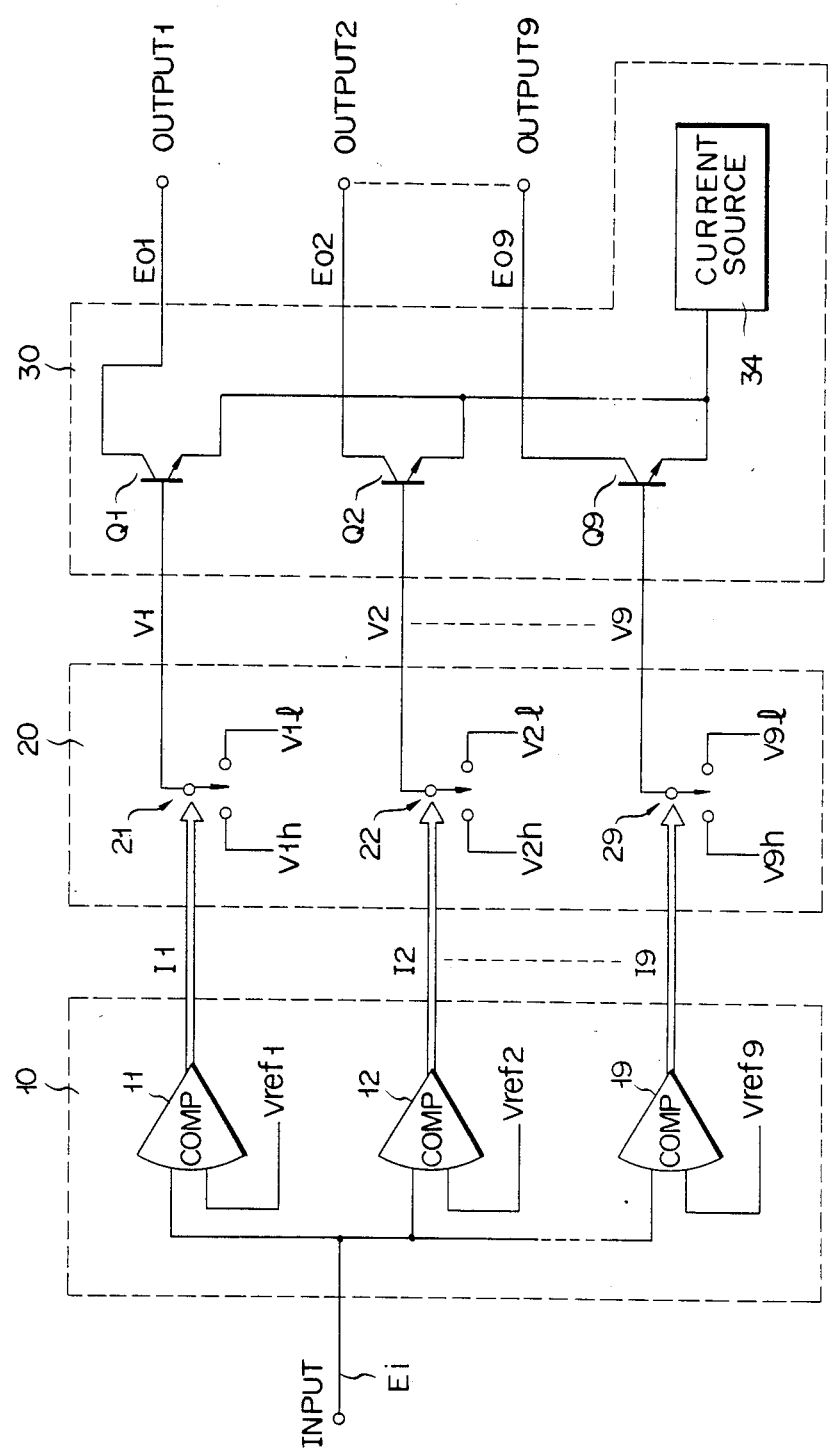
FIG. 7 shows a modification of the FIG. 1 configuration, wherein any one of nine outputs is obtainable according to the level of one input.

FIG. 7 shows a modification of FIG. 1 configuration, wherein any one of nine outputs Eo1 to Eo9 is obtainable according to the specific level of one input Ei. Input Ei has nine levels, i.e. H, M2, M3 --- M8 and L. The level H is detected by a first comparator 11, and level L is detected by a ninth comparator 19. Similarly, the levels M2, M3 --- M8 are detected by second, third --- eighth comparators 12, 13 --- 18. Comparators 11, 12, --- 19 provide switch instructions I1, I2 --- I9. Instructions I1, I2 --- I9 designate the potential-selection state of switches 21, 22 --- 29. Any one of switches 21 to 29 provides one bias signal whose potential is highest. Which switch provides the highest bias signal is determined in accordance with instructions I1 to I9, or the level of input Ei. For instance, when Ei=H, comparator 11 provides instruction I1 so that the potential of bias signal V1 is highest among signals V1 to V9. Then, only transistor Q1 is conducted, and output Eo1 is obtained.

Although specific configurations have been illustrated and described herein, it is not intended that the invention be limited to the elements and configurations or constructions disclosed. A skilled person in the art will recognize that particular elements or subconstructions may be used without departing from the scope of the claimed invention.

What we claim is:

1. A differential switch circuit comprising:
   input means for receiving three or more distinct levels of an input signal and providing switch instructions respectively corresponding to said distinct levels, said input means including a high level comparator for detecting the highest level of said input signal to provide a high level instruction which is one of said switch instructions, the comparison level of said high level comparator being defined by a power supply potential of the switch circuit, said input means also including a low level comparator for detecting the lowest level of said input signal to provide a low level instruction which is one of said switch instructions, the comparison level of said low level comparator being defined by a circuit ground potential;
   bias means, coupled to said input means and being responsive to said switch instructions, for generating three or more bias signals respectively corresponding to said switch instructions; and
   differential transistor means, coupled to said bias means and being responsive to said bias signals, for generating three or more outputs according to said bias signals, one of said outputs corresponding to one level of said input signal.

2. The switch circuit of claim 3, wherein said input means includes:
   a medium level comparator for detecting a level between the highest level and the lowest level of said input signal to provide a medium level instruction which is one of said switch instructions.

3. The switch circuit of claim 4, wherein said bias means includes:
   a first bias source being responsive to said high level instruction for generating a first bias signal which is one of said bias signals, said first bias signal having a first high potential when said high level instruction is provided, and said first bias signal having a first low potential when said high level instruction is not provided.

4. The switch circuit of claim 5, wherein said bias means includes:
   a second bias source being responsive to said medium level instruction for generating a second bias signal which is one of said bias signals, said second bias signal having a second high potential when said medium level instruction is provided, and said second bias signal having a second low potential when said medium level instruction is not provided.

5. The switch circuit of claim 4, wherein said bias means includes:
   a third bias source being responsive to said low level instruction for generating a third bias signal which is one of said bias signals, said third bias signal having a third high potential when said low level instruction is provided, and said third bias signal having a third low potential when said low level instruction is not provided.

6. The switch circuit of any one of claims 1 to 7, wherein said differential transistor means includes:
   current source means; and
   three or more switch transistors each of which emitter is coupled to said current source means, each of which base receives one of said bias signals, and each of which collector provides one of said outputs.

7. The switch circuit according to claim 1 wherein said high level comparator includes a first conductivity type transistor whose emitter receives said power supply potential, whose base receives said input signal, and whose collector provides said high level instruction, and wherein said low level comparator includes a second conductivity type transistor whose emitter receives said circuit ground potential, whose base receives said input signal, and whose collector provides said low level instruction.

8. A differential switch circuit comprising:
   input means for receiving three or more distinct levels of an input signal and providing switch instructions respectively corresponding to said distinct levels, said input means including a high level comparator for detecting the highest level of said input signal to provide a high level instruction which is one of said switch instructions, a comparison level of said high level comparator being defined by a power supply potential of the switch circuit, said high level comparator including a first conductivity type first transistor whose emitter receives said power supply potential, whose base receives said input signal, and whose collector provides a first current corresponding to one of said switch instructions when the potential difference between the emitter and the base of said first transistor exceeds its base threshold voltage;
   bias means, coupled to said input means and being responsive to said switch instructions, for generating three or more bias signals respectively corresponding to said switch instructions, said bias means including a second conductivity type second transistor whose base receives said first current and whose emitter receives a circuit ground potential, and a first circuit containing serially connected resistive elements coupled between said power supply potential and said circuit ground potential, in which the juncture between two of said resistive elements is coupled to the collector of said second transistor, said juncture providing a first bias signal corresponding to one of said bias signals, said first bias signal having a first low potential when said first current is provided, and said first bias signal having a first high potential when said first current is not provided; and
   differential transistor means, coupled to said bias means and being responsive to said bias signals, for generating three or more outputs according to said bias signals, one of said outputs corresponding to one level of said input signal.

9. The switch circuit of claim 8, wherein said first circuit includes:
   a P-N junction connected in series with said resistive elements, said P-N junction being forwardly biased by means of said power supply potential and the forward voltage drop of said P-N junction having substantially the same temperature coefficient as a temperature coefficient of the base threshold voltage of said switch transistor which receives at its base said first bias signal.

10. The switch circuit of claim 8 or 9, wherein said input means includes:
a second conductivity type third transistor whose emitter receives a circuit ground potential, whose base receives said input signal, and whose collector provides a second current corresponding to one of said switch instructions when the potential difference between the emitter and the base of said third transistor exceeds the base threshold voltage thereof,
and wherein said bias means includes:
a second conductivity type fourth transistor whose base receives said second current and being coupled via a load resistive element to a power supply potential of the switch circuit, and whose emitter recieves said circuit ground potential; and
a second circuit containing serially connected resistive elements coupled between a given bias potential and the collector of said fourth transistor, in which the juncture between two of said resistive elements provides a second bias signal corresponding to one of said bias signals, said second bias signal having a second low potential when said second current is provided, and said second bias signal having a second high potential when said second current is not provided.

11. The switch circuit of claim 8 or 9, wherein said bias means includes:
a second conductivity type additional transistor whose base receives one of said switch instructions directly corresponding to said input signal, and whose emitter receives a circuit ground potential, said additional transistor being turned on when the potential difference between the emitter and the base thereof exceeds its base threshold voltage by one of said switch instructions; and
an auxiliary circuit containing serially connected resistive elements coupled between a given bias potential and the collector of said additional transistor, in which the juncture between two of said resistive elements provides a prescribed bias signal corresponding to one of said bias signals, said prescribed bias signal having a predetermined low potential when said additional transistor is in ON state, and said prescribed bias signal having a predetermined high potential when said additional transistor is in OFF state.

12. The switch circuit of claim 11, further comprising a bias supply circuit coupled between said power supply potential and said circuit ground potential, for generating said given bias potential.

13. The switch circuit of claim 10, wherein said bias means includes:
a second conductivity type fifth transistor whose base receives one of said switch instructions directly corresponding to said input signal, and whose emitter receives a circuit ground potential, said fifth transistor being turned on when the potential difference between the emitter and the base thereof exceeds its base threshold voltage by one of said switch instructions; and
a third circuit containing serially connected resistive elements coupled between a given bias potential and the collector of said fifth transistor, in which the juncture between two of said resistive elements provides a third bias signal corresponding to one of said bias signals, said third bias signal having a third low potential when said fifth transistor is in ON state, and said third bias signal having a third high potential when said fifth transistor is in OFF state.

14. The switch circuit of claim 11, wherein further comprising a bias supply circuit coupled between said power supply potential and said circuit ground potential, for generating said given bias potential.

15. The switch circuit of claim 21, wherein further comprising a bias supply circuit coupled between said power supply potential and said circuit ground potential, for generating said given bias potential.

16. A differential switch circuit comprising:
input means for receiving three or more distinct levels of an input signal and providing switch instructions respectively corresponding to said distinct levels, said input means including a high level comparator for detecting the highest level of said input signal to provide a high level instruction which is one of said switch instructions, a comparison level of said high level comparator being defined by a power supply potential of the switch circuit, said high level comparator including a first conductivity type first transistor whose emitter receives said power supply potential, whose base receives said input signal, and whose collector provides a first current corresponding to one of said switch instructions when the potential difference between the emitter and the base of said first transistor exceeds its base threshold voltage;
bias means, coupled to said input means and being responsive to said switch instructions, for generating three or more bias signals respectively corresponding to said switch instructions, said bias means including a second conductivity type second transistor whose base receives said first current and whose emitter receives a circuit ground potential, and serially connected resistive elements coupled between said power supply potential and said circuit ground potential, in which the juncture between two of said resistive elements is coupled to the collector of said second transistor, said juncture providing a first bias signal corresponding to one of said bias signals, said first bias signal having a first low potential when said first current is provided, and said first bias signal having a first high potential when said first current is not provided; and
differential transistor means, coupled to said bias means and being responsive to said bias signals, for generating three or more outputs according to said bias signals, one of said outputs corresponding to one level of said input signal.

17. The switch circuit of claim 16, wherein said input means includes:
a second conductivity type third transistor whose emitter receives a circuit ground potential, whose base receives said input signal, and whose collector provides a second current corresponding to one of said switch instructions when the potential difference between the emitter and the base of said third transistor exceeds the base threshold voltage thereof,
and wherein said bias means includes:
a first conductivity type fourth transistor whose base receives said second current and whose collector receives said circuit ground potential; and
a second resistive element coupled between a given bias potential and the emitter of said fourth transistor, in which the emitter of said fourth transistor provides a second bias signal corresponding to one of said bias signals, said second bias signal having a second low potential when said second current is provided, and said second bias signal having a second high potential when said second current is not provided.

18. The switch circuit of claim 11, wherein said bias means includes:
a second conductivity type fifth transistor whose base receives said second bias signal and whose emitter receives a circuit ground potential, said fifth transistor being turned on when said second bias signal has said second high potential; and
a third resistive element coupled between a given bias potential and the collector of said fifth transistor, in which the collector of said fifth transistor provides a third bias signal corresponding to one of said bias signals, said third bias signal having a third low potential when said fifth transistor is in ON state, and said third bias signal having a third high potential when said fifth transistor is in OFF state.

19. The switch circuit of claim 17, wherein said third transistor is provided with a level shift element which is connected in series with the base of said third transistor.

20. The switch circuit of claim 16, wherein said first transistor is provided with a level shift element which is connected in series with the base of said first transistor.

21. A differential amplifier circuit with a differential switch circuit comprising:
a first pair of differential transistors being equipped with a first switch transistor whose collector is coupled to the emitter of each of said first pair of differential transistors;
a second pair of differential transistors whose collectors respectively coupled to the collectors of said first pair of transistors, said second pair being equipped with a second switch transistor whose collector is coupled to the emitter of each of said second pair of differential transistors;
a third pair of differential transistors whose collectors respectively coupled to the collectors of said first pair of transistors, said third pair being equipped with a third switch transistor whose collector is coupled to the emitter of each of said third pair of differential transistors, wherein a load impedance coupled to one collector of said first pair of differential transistors is commonly used for the load of said second and third pairs of differential transistors;
a constant current source coupled to each emitter of said first, second and third switch transistors;
a first bias switch circuit being responsive to the level of a mode input applied thereto, for supplying the base of said first switch transistor with a first switching signal so as to conduct said first switch transistor when the level of said mode input is maximum;
a second bias switch circuit being responsive to said mode input and to a bias input applied thereto, for supplying the base of said second switch transistor with a second switching signal so as to conduct said second switch transistor when the level of said mode input is medium and the level of said bias input is maximum; and
a third bias switch circuit being responsive to said mode input and to said bias input, for supplying the base of said third switch transistor with a third switching signal so as to conduct said third switch transistor when the level of said mode input is minimum and the level of said bias input is maximum.

22. The circuit of claim 19, wherein there is provided with a fourth switch transistor whose collector and emitter are coupled to the collector and emitter of said first switch transistor and whose base receives an inverted bias input, the level of said inverted bias input corresponding to the inverted signal level of said bias input.

23. A differential switch circuit comprising:
a first comparator having a first reference level equal to a power supply potential of said switching circuit, and being responsive to an input signal applied thereto, for comparing a level of said input signal with said first reference level and providing a first switch instruction when the input signal level exceeds said first reference level;
a second comparator having a second reference level and being responsive to said input signal, for comparing a level of said input signal with said second reference level and providing a second switch instruction when the input signal level exceeds said second reference level which is lower than said first reference level;
a third comparator having a third reference level and being responsive to said input signal, for comparing a level of said input signal with said third reference level and providing a third switch instruction when the input signal level falls down said third reference level which is lower than said first reference level;
a first bias source coupled to said first comparator for generating a first bias signal which has a first high potential when said first switch instruction is provided, and which has a first low potential when said first switch instruction is not provided;
a second bias source coupled to said second comparator for generating a second bias signal which has a second high potential when said second switch instruction is provided, and which has a second low potential when said second switch instruction is not provided;
a third bias source coupled to said third comparator for generating a third bias signal which has a third high potential when said third switch instruction is provided, and which has a third low potential when said third switch instruction is not provided, said second high potential being lower than said first high potential and being higher than said first low potential or said third low potential, and said third high potential being higher than said first low potential or second low potential;
a first switch transistor coupled at its base to said first bias source, for outputting from its collector a first output when said first bias signal has said first high potential;
a second switch transistor coupled at its base to said second bias source, for outputting from its collector a second output when said second bias signal has said second high potential;
a third switch transistor coupled at its base to said third bias source, for outputting from its collector a third output when said third bias signal has said third high potential; and
a current source coupled to each emitter of said first, second and third switch transistors, for feeding these emitters with a given current.

24. The switch circuit of claim 23, wherein said second reference level is selected to be higher than said third reference level so that said first, second and third transistors are all cut off when the level of said input signal corresponds to a level being lower than said second reference level and being higher than said third reference level.

25. The switch circuit of claim 23, wherein said third reference level is selected to be equal to or more than said second reference level so that said second output is obtained when the level of said input signal corresponds to a level being lower then said first reference level and being higher than said third reference level.

26. A differential switch circuit comprising:
  input means for receiving an input signal which may assume three or more distinct levels and generating switching signals which respectively correspond to said distinct levels, signal, said input means including:
    first comparison means for generating a first switching signal when the level of said input signal is greater than a first reference level, said first reference level being equal to a power supply potential of said switching circuit and
    second comparison means for generating a second switching signal when the level of said input signal is greater than a second reference level, said second reference level being lower than said first reference level;
  bias means, connected to said input means, for generating three or more bias signals which respectively correspond to said switching signals; and
  switching means, connected to said bias means, for generating three or more output signals respectively corresponding to said bias signals.

27. A differential switch circuit comprising:
  first comparison means for receiving an input signal and comparing the level of said input signal with a first reference level corresponding to a power supply potential of said switch circuit and generating a first switching signal when the input signal level exceeds said first reference level;
  second comparison means for receiving said input signal and comparing the level of said input signal level with a second reference level corresponding to the ground potential of said switch circuit and generating a second switching signal when said input signal exceeds said second reference level;
  third comparison means for receiving said input signal and comparing its level with a third reference level which is less than said first reference level but greater than said second reference level, and generating a third switching signal when said input signal level falls below said first reference level;
  first bias means, connected to said first comparison means, for generating a first bias signal when said first switching signal is received;
  second bias means, connected to said second comparison means, for generating a second bias signal when said second switching signal is received;
  third bias means, connected to said third comparison means, for generating a third bias signal when said third switching signal is received;
  first switching means, connected to said first bias means, for generating a first output when said first bias signal is received;
  second switching means, connected to said second bias means, for generating a second output signal when said second bias signal is received;
  third switching means, connected to said third bias means, for generating a third output signal when said third bias signal is received; and
  current source means for providing current to each of said switching means.

* * * * *